United States Patent [19]
Shin et al.

[11] Patent Number: 6,028,774
[45] Date of Patent: Feb. 22, 2000

[54] BASE CARDS AND IC CARDS USING THE SAME

[75] Inventors: Bo Hyun Shin, Cheonan; Jung Hwan Cuun, Seoul; Min Cheol An, Suwon, all of Rep. of Korea

[73] Assignee: Samsung Electronics Co., Ltd., Suwon, Rep. of Korea

[21] Appl. No.: 09/081,098

[22] Filed: May 19, 1998

[30] Foreign Application Priority Data

Jun. 18, 1997 [KR] Rep. of Korea .................... 97-25372

[51] Int. Cl.[7] .................................................. H01L 23/13
[52] U.S. Cl. .......................... 361/764; 361/737; 361/761; 257/679; 257/787; 438/124; 438/126
[58] Field of Search ................................. 235/492, 488; 257/679, 787; 361/737, 761–764, 807, 809; 438/124, 126, 127

[56] References Cited

U.S. PATENT DOCUMENTS

| 4,040,874 | 8/1977 | Yerman | 438/127 |
| 4,198,444 | 4/1980 | Yerman | 438/127 |
| 4,222,516 | 9/1980 | Badet et al. | 235/492 |
| 4,625,102 | 11/1986 | Rebjock et al. | 235/492 |
| 4,737,620 | 4/1988 | Mollet et al. | 235/492 |
| 5,283,423 | 2/1994 | Venambre et al. | 235/492 |

Primary Examiner—Leo P. Picard
Assistant Examiner—John B. Vigushin
Attorney, Agent, or Firm—Jones Volentine, LLP

[57] ABSTRACT

A base card improves the mounting reliability of a COB package particularly when the package has molding by-products such as epoxy burrs or molding flashes. The base card has a COB package receiving part made up of first and second sections. The receiving part is stepped so that the sections thereof have shapes that are complementary to that of and for receiving a peripheral portion of the printed circuit board of the COB package and the package body the COB package, respectively. The second section has a bevel at the transition of the first section into the second section. This bevel helps define a space in which the by-products are accommodated when the COB package is mounted to the base card. Further, the second section of the COB package receiving part may define an opening in the bottom surface of the base card. This opening also prevents damage to the base card by preventing the need for the bottom of the package body to bear against the bottom of the base card when the COB package is mounted to the base card.

20 Claims, 10 Drawing Sheets

BASE CARDS AND IC CARDS USING THE SAME

BACKGROUND OF THE INVENTION

1. Field of the Invention

The present invention relates generally to base cards for use in manufacturing semiconductor chip cards and to the semiconductor chip cards themselves. More particularly, the present invention relates to a base card which overcomes problems which have in the past arisen when mounting a Chip on Board (COB) package into the base card in the manufacture of a chip card.

2. Description of the Related Art

To address the simultaneous and competing demands for high numbers of input/output (I/O) pins and miniaturization of the semiconductor device packages, a new packaging technology has been proposed in which a semiconductor device is directly mounted on a printed circuit board (PCB) without constructing a package assembly using a lead frame. Such a semiconductor device package is referred to as a COB (Chip On Board) package.

Memory cards have become the prominent high capacity memory media in current use. They have been developed for storing and/or recording captions, sounds, and stationary video images of electronic entertainment machines and of digital still cameras. Memory cards have also been developed as substitutes for hard disks of computers, and for use in portable information storage and retrieval machines. Such memory cards, in general, are manufactured by packaging a number of memory chips into a single base card.

Memory cards may include miniature cards, compact flash cards and smart card media. Among these, miniature cards and compact flash cards have disadvantages of high cost and bulkiness because they must have a built-in controller.

IC cards such as SmartMedia or SSFDC (Solid State Floppy Disc Cards) are used for storing digital signals and contain a COB package having a built-in memory chip. These IC cards are advantageous over the conventional memory cards in that they are smaller, have a high extensibility due to the identical pin numbers between generations, and are very portable. SmartMedia is a new small card for recording or storing captions, sounds or stationary video images generated by digital entertainment machines or portable computers. SmartMedia is also used in an embedded or removed state for storing information of digital still cameras. Moreover, SmartMedia is expected to be extensively used for a wide range of applications since it has a greater capacity than diskettes or ID cards using magnetic tape, and is easy to store and handle.

All IC cards should have means which allow them to be electrically connected to external appliances. The cards should also have standardized means which allow them to be freely attached to or detached from appliances, such as digital still cameras, produced by different manufacturers in the same way that floppy disks can be used with various makes of computers.

A chip card is produced by mounting a COB package containing a semiconductor chip to a standardized base card. The base card is used for ease in handling and for aiding an electrical connection between the COB package and the external appliances. This is because the size of the COB package makes it difficult to handle and because it is difficult or impossible to electrically connect the COB package itself to external electronic appliances such as digital still cameras.

The conventional base card and the chip card using it will be described with reference to FIGS. 1 to 3. FIG. 1 is an exploded perspective view of a COB package mounted to a conventional base card; FIG. 2 is a cross-sectional view taken along line 2—2 in FIG. 1; and FIG. 3 is a perspective view of a conventional chip card.

With reference to FIGS. 1 to 3, the conventional chip card 100 consists of a COB package 20, to which a semiconductor chip 40 is mounted, and a base card 10 for receiving the package 20.

The COB package 20 comprises a semiconductor chip 40, a printed circuit board 23, bonding wires 29 and package body 24. The chip 40 is attached to a chip bonding area 21 of the upper surface of the printed circuit board 23, and the chip 40 is electrically connected to circuit patterns 26 by bonding wires 29 made of gold (Au) or aluminum (Al). External connection means 27 are formed on the bottom surface of the board 20 and are electrically connected to the circuit patterns 26 by way of via holes 28, the inner walls of which are plated with an electrically conductive material. Thus, the circuit patterns 26, which are electrically connected to the chip 40 by the bonding wires 29, are also electrically connected to the external connection means 27 by way of the via holes 28. The upper surface of the printed circuit board 23 is molded with a thermosetting compound ('molding compound'), such as an epoxy resin, to form the package body 24. This package body 24 protects the chip 40 from external stresses. Molding dams 22 may be formed on the printed circuit board 23 to prevent the molding compound from flowing out during the molding process. Therefore, the molding dams 22 surround the package body 24.

The base card 10 has a receiving part 13 which has a shape complementary with and for receiving the package body 24 of the COB package. The receiving part 13 is usually formed at the middle of the base card and has a downwardly stepped configuration. The receiving part 13 has two sections: a first section 12 which receives the periphery of the COB package, and a second section 14 which extends downward from the first section 12 and receives the package body 24.

The mounting of the COB package 20 to the base card 10 will be described hereinafter. An adhesion means 30, such as adhesive tape, is placed on the bottom of the first section 12 of the receiving part 13. The COB package 20 is aligned with the receiving part 13, and the package body 24 of COB package 20 is fit into the second section 14 of the receiving part 13 while the periphery of the printed circuit board 23 is fit into the first section 12 of the receiving part 13. Then, the periphery of the printed circuit board 23 is pressed while supplying heat thereto by using, for example, a thermo-press machine (not shown). This completes the attaching of the COB package to base card 10. Note that the adhesive tape 30 has an opening 32 through which the second section 14 of the receiving part 13 is exposed.

Accordingly, the conventional chip card 100 has a structure in which the external connection means 27 of the COB package 20 is exposed and used for the electrical connection of the card 100 to external electronic appliances such as digital still cameras.

The structure of the chip card 100 will described in more detail hereinafter. Since the chip card 100 is manufactured by assembling a standardized base card 10 and standardized COB package 20 together, the thickness of the base card 10 when added to that of the package 20 must be uniform. In general, referring to FIG. 2, the thickness (c) of the package 20 is 640 $\mu$m∓50 $\mu$m, the overall thickness (a) of the card 10 is 810 μm∓20 μm, and the thickness (b) of the bottom of the second section 14 of the receiving part 13 is 140 μm∓20 μm. Because the thickness (b) of the second section 14 is less than the overall thickness (a) of base card 10, it is difficult to achieve uniformity in the thickness of the chip card 100 along the bottom of the second section 14 of the receiving part 13.

The manufacturing process of the base card will be described with reference to FIG. 4. The mold 60 used for manufacturing the base card consists of upper 63 and lower 65 mold dies, which when fit together form a cavity 61 which has the same configuration as that of the base card. A fluid molding compound 70 is introduced into the cavity 61 to form a molded base card article. The base card has different thicknesses; the periphery has the greatest thickness, the first section of the receiving part has an intermediate thickness, and the central second section of the receiving part has the smallest thickness. Therefore, the flow rate of the fluid molding compound becomes greatest at the bottom of the second section of the receiving part, possibly resulting in an incomplete molding at this location.

The incomplete molding may produce unevenness or voids in the bottom of the second section 14 of the receiving part 13. The latter may cause the second section of the receiving part to break after the COB package is mounted on the base card.

Moreover, the COB packages may contain by-products 25 produced during the molding process ('molding by-products'), such as epoxy burrs or molding flashes, since they are molded onto a PCB by using a fluid molding compound. Thus, with reference to FIG. 5, a mounting failure can occur due to a molding by-product 25 formed on the outside of the package body 24 of the COB package when the COB package is mounted to the receiving part 13 of the base card 10.

Furthermore, as mentioned above, the COB package 20 is manufactured by encapsulating the chip 40 on the printed circuit board 23. In this case, the printed circuit board 23 may have dams (22 in FIG. 1) at its periphery surrounding the chip 40 to prevent the flowing out of fluid molding compound used to form the encapsulant. However, the dams are not as rigid as the dam bars of a conventional lead frame package. Accordingly, a larger amount of molding by-products 25 are formed than when the package is molded using a lead frame. Moreover, it is difficult to remove the by-products 25 from the COB package since the by-products 25 are present on the surface thereof where the circuit patterns are formed. Specifically, any chemical or mechanical deflash process to remove the by-products may damage the circuit patterns or the printed circuit board itself. On the other hand, deflash and dam-bar trimming procedures can easily be used to remove the by-products of a molding process from a package having a conventional lead frame without damage to the lead frame or circuit board.

In addition, the gate into which the fluid molding compound is introduced or the air vents through which the air communicates may be degraded by large molding by-products 25 such as epoxy burrs having a thickness of, for example, 0.5 mm or more.

When the COB package 20 having the molding by-products 25 is placed on and mounted to the base card 10, the by-products 25 will be located at the edges where the inclined surface 16 of the receiving part 13 is in contact with the bottom of the first section 12 thereof, resulting in a mismatch between the package 20 and the base card 10 as shown in FIG. 5.

Moreover, when there is a mismatch between the COB package 20 and the base card 10, the pressure applied to the COB package 20 to attach it to the receiving part 13 of the base card will concentrate at the bottom of the second section 14 of the receiving part 13, resulting in the failure of the base card 10 at the bottom of the second section 14 of the receiving part 13.

SUMMARY OF THE INVENTION

Thus, an object of the present invention is to overcome the disadvantages associated with the bottom of the conventional base card being relatively thin.

Another object of the present invention is to provide a base card and a chip card using the same, in which the COB package can be reliably mounted to the base card even when the package thereof has molding process by-products such as epoxy burrs or molding flashes.

To achieve these and other objects, the present invention provides a chip card or a base card for use in manufacturing a chip card in which the COB package has a printed circuit board, a semiconductor chip electrically connected to the printed circuit board via bonding wires, and a package body encapsulating the chip and the bonding wires. The printed circuit board has a periphery surrounding the body.

The base card has a first section which has a shape complementary to that of and for receiving the periphery of the COB package, and a second section, which is stepped downward at an inclination with respect to the first section and receives the package body. This second section includes an inclined side surface and a bevel formed at a location where the first section would otherwise meet the inclined surface of the second section.

In another aspect, the present invention provides a base card with a first section having a shape complementary to that of and for receiving the periphery of the COB package, and a second section, which is inclined downward with respect to the first section and receives the package body. This second section has an inclined side surface and forms an opening in the bottom surface of the base card. The package body of the COB package is exposed through this opening.

BRIEF DESCRIPTION OF THE DRAWINGS

These and various other features and advantages of the present invention will be described with reference to the drawings, in which.

DETAILED DESCRIPTION OF THE PREFERRED EMBODIMENTS

Figure 1:
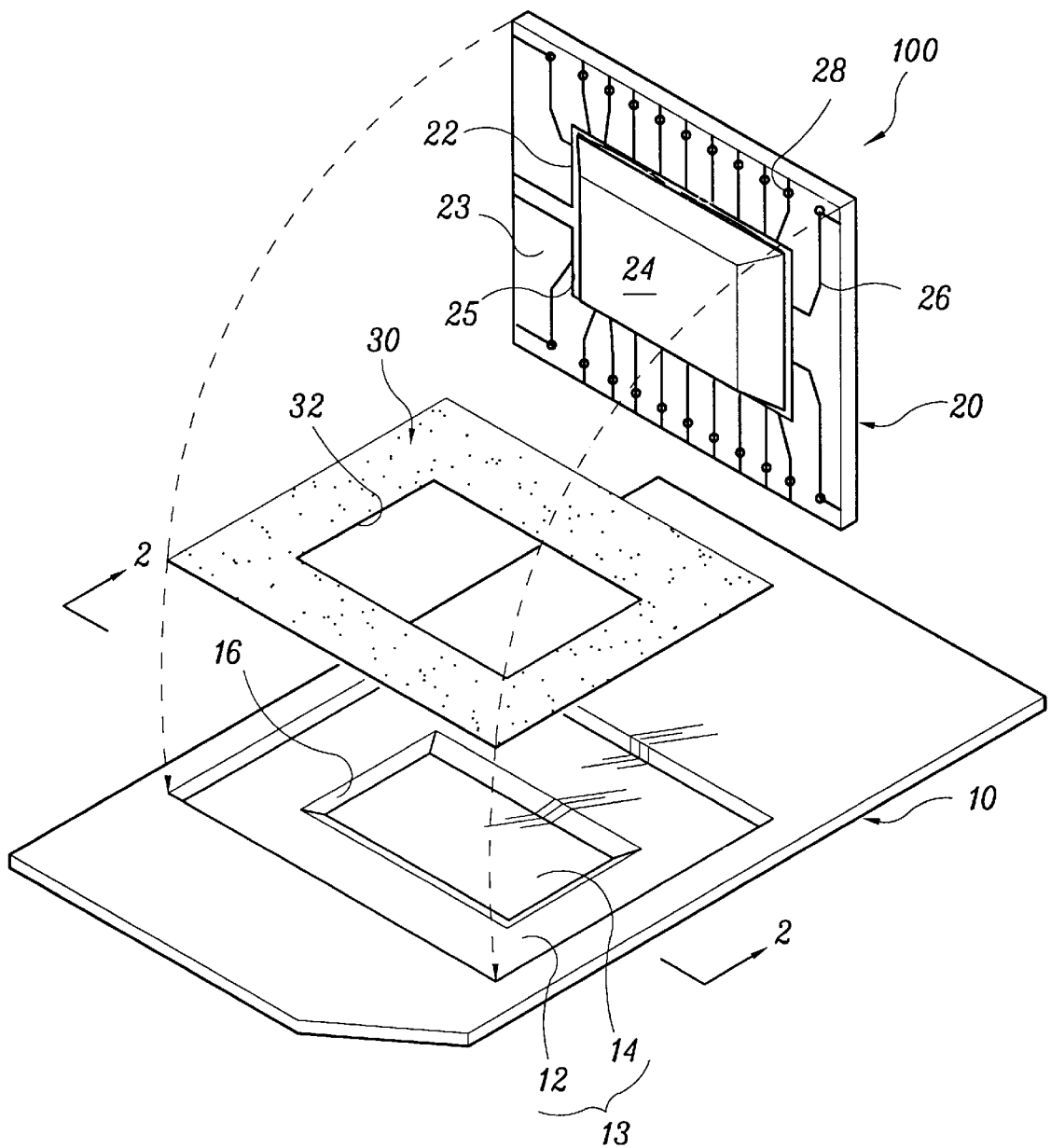
FIG. 1 is an exploded perspective view of a COB package mounted to a conventional base card.
Figure 2:
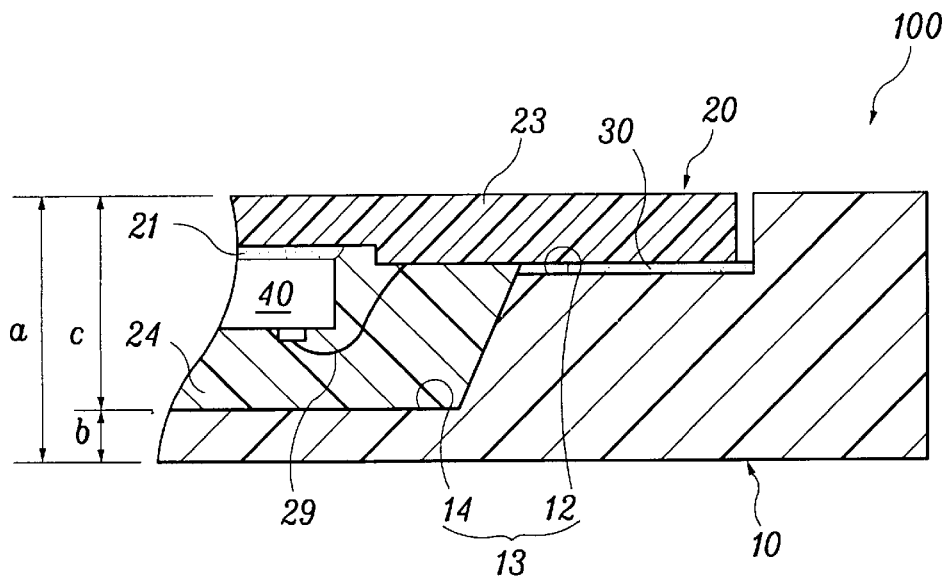
FIG. 2 is a partial cross-sectional view taken along line 2—2 in FIG. 1.

The present invention will now be described in more detail with reference to accompanying drawings. Like reference numerals refer to the same or similar structural elements.

Figure 6:
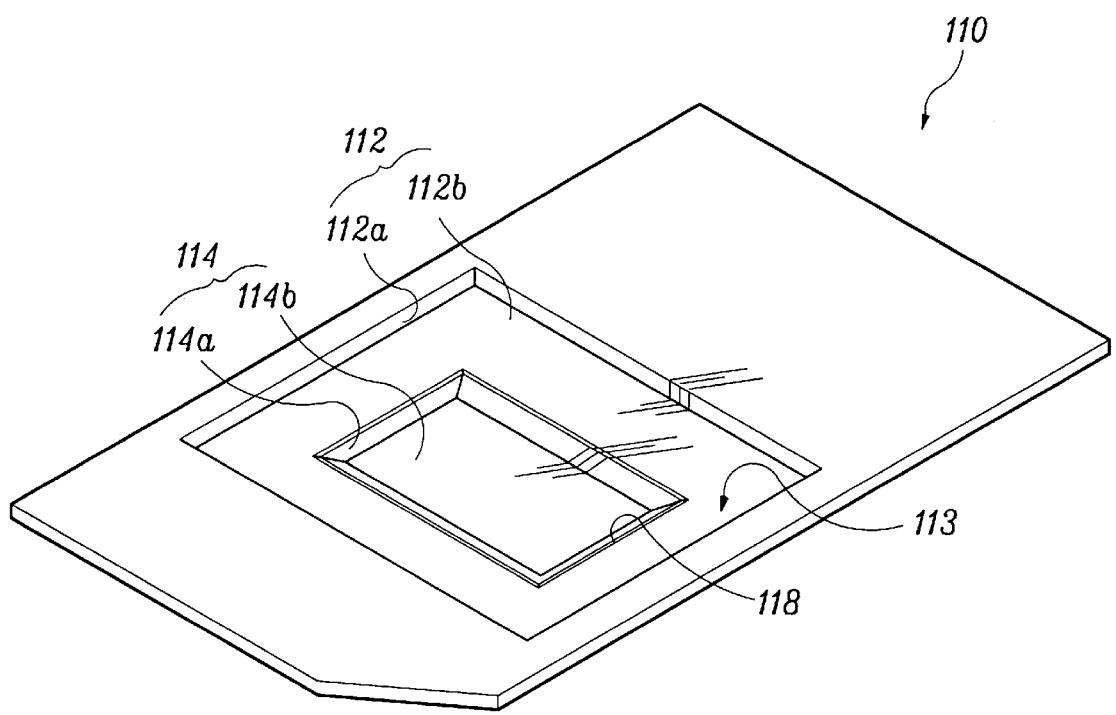
FIG. 6 is a perspective view of a first embodiment of the base card according to the present invention.

FIG. 6 is a perspective view of a first embodiment of a base card according to the present invention. In this embodiment, the base card has a bevel where the first section of the receiving part meets the inclined surface of the second section of the receiving part. More specifically, an inner part of the base card 110 is stepped downwardly with respect to one surface, for example, the upper surface thereof to form a receiving part 113. The receiving part 113 is for receiving a COB package, and consists of a first section 112 and a second section 114.

Figure 7:
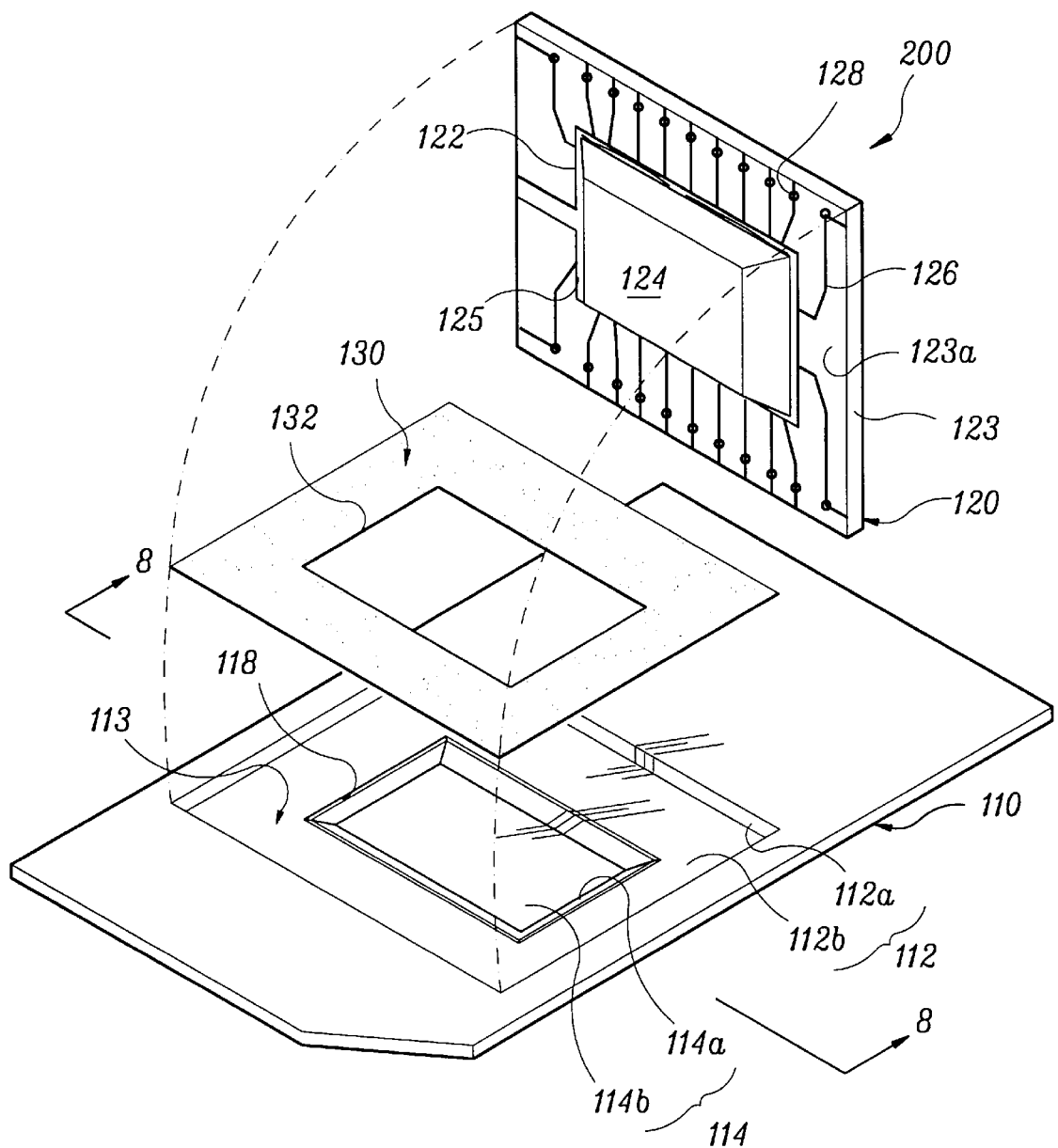
FIG. 7 is an exploded perspective view of a first embodiment of a chip card comprising the base card shown in FIG. 6.
Figure 8:
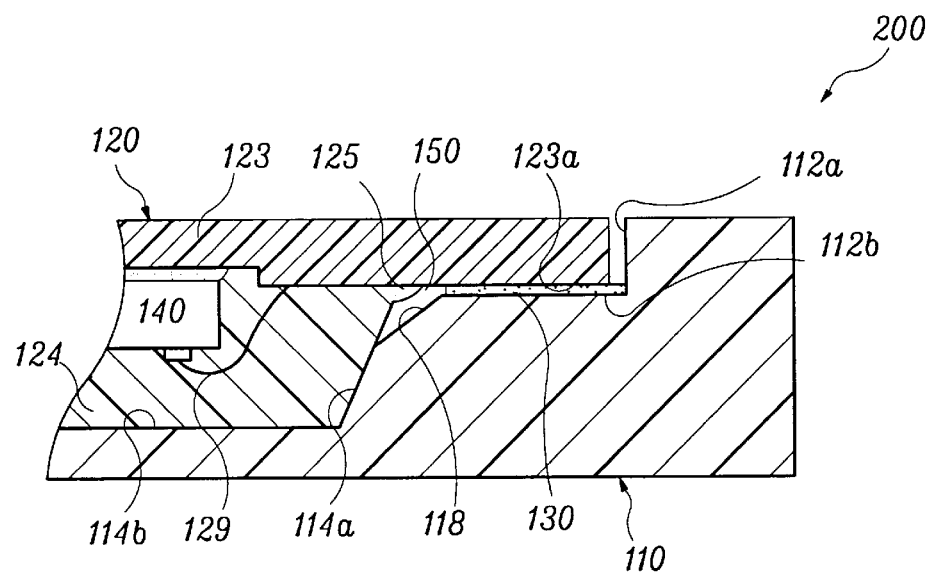
FIG. 8 is a partial cross-sectional view taken along line 8—8 in FIG. 7.

In FIG. 7 and FIG. 8, the COB package 120 has a printed circuit board 123, a semiconductor chip 140 electrically connected to the printed circuit board 123 via bonding wires 129, and a package body 124 encapsulating the chip 140 and the bonding wires 129. The first section 112 of the receiving part 113 has a shape complementary to that of and for receiving the periphery of the printed circuit board 123 of the COB package; and the second section 114, which is located centrally of the first section 112, extends downwardly at an inclination from the bottom 112b of the first section 112 and receives the package body 124. The first and second sections 112 and 114 are defined by downwardly extending surfaces 112a, 114a and bottom surfaces 112b, 114b, respectively.

The characteristic feature of this embodiment is a bevel 118 where the bottom surface 112b of the first section 112 of the receiving part 113 joins the inclined surface 114a of the second section 114. The inclined surface 114a has the same or nearly the same slope as that of the package body 124 of the COB package 120 which will be fitted into the second section 114 of the receiving part 113 of the base card 110. The bevel 118 may be formed by molding during the process of molding the based card, or by a machining operation in which a corner where the bottom surface 112b meets the inclined surface 114a is removed.

The reason for the provision of the bevel 118 will be described hereinafter with reference to FIGS. 7 and 8.

The chip card 200 consists of a COB package 120, and a base card 110 which receives and is attached to the package 120 with adhesion means 130 such as adhesive tape.

The COB package 120 has a printed circuit board 123, a semiconductor chip 140 electrically connected to the printed circuit board via bonding wires 129, and a package body 124 encapsulating the chip 140 and the bonding wires 129. The periphery 123a of the printed circuit board 123 surrounds the package body 124.

Figure 3:
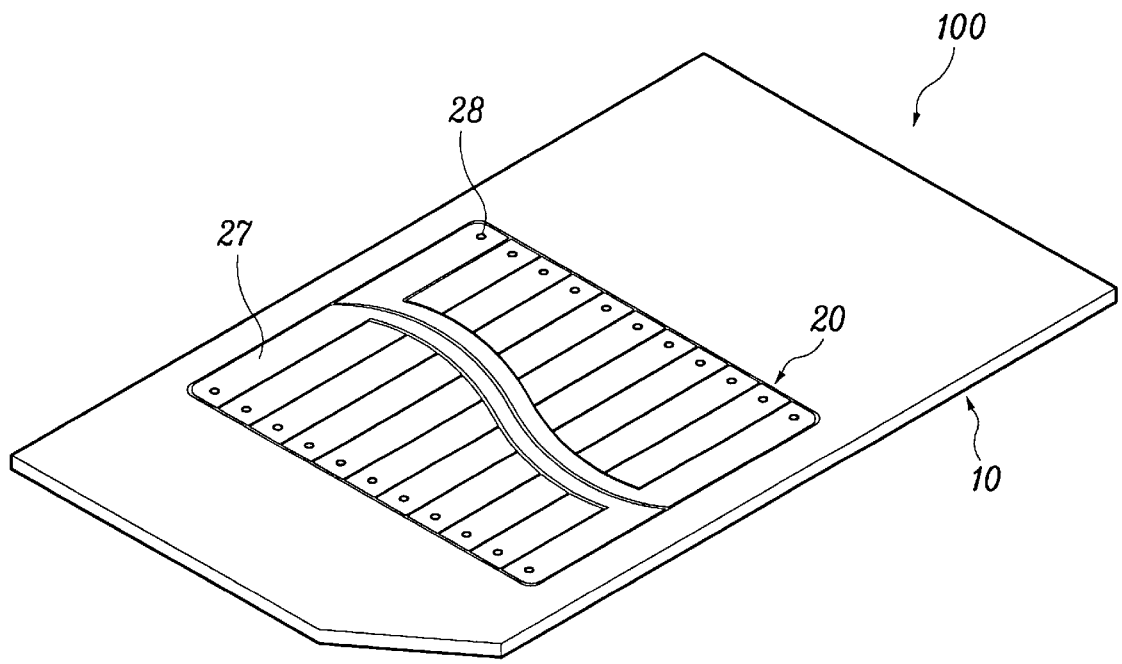
FIG. 3 is a perspective view of a conventional chip card.
Figure 4:
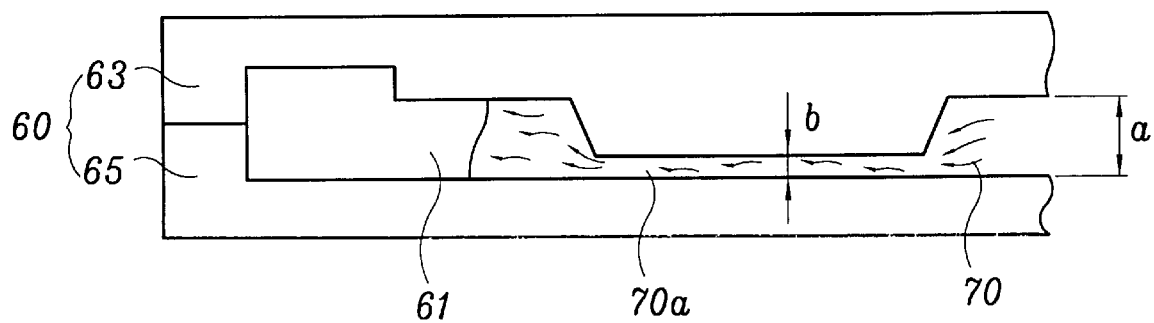
FIG. 4 is a cross-sectional view of a mold used to form the base card shown in FIG. 1.
Figure 5:
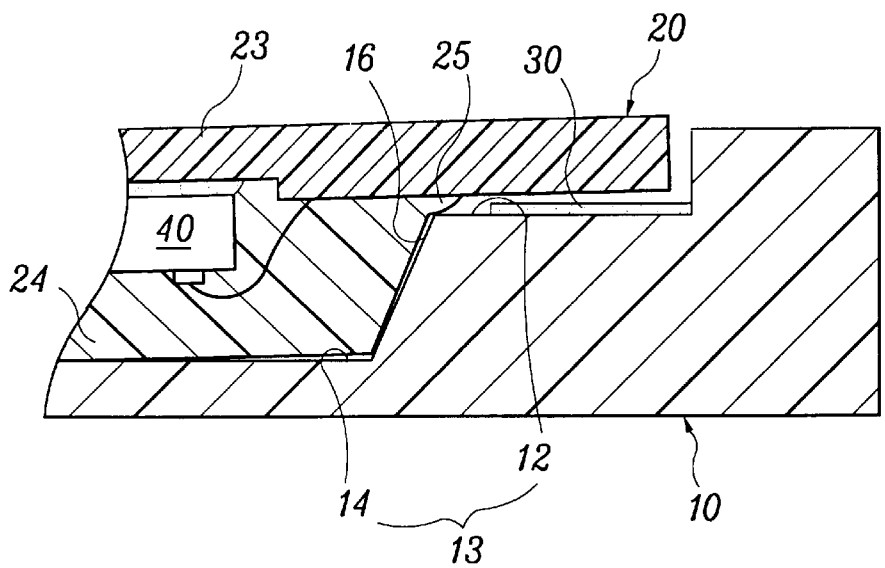
FIG. 5 is a partial cross-sectional view of a defective chip card.

The chip 140 is attached to chip bonding area 121 of the upper surface of printed circuit board 123, and the chip 140 is electrically connected to circuit patterns 126 by bonding wires 129 made of gold (Au) or aluminum (Al). External connection means (27 in FIG. 3) are formed on the lower surface of the board 123 and are electrically connected to circuit patterns 126 on the upper surface of the printed circuit board 123 by way of via holes 128. The inner walls of the via holes 128 are plated with an electrically conductive material. Thus, the circuit patterns 126, which are electrically connected to the chip 140 with bonding wires 129, are also electrically connected to external connection means 27 by way of the via holes 128. The upper surface of the printed circuit board 123 is molded with a thermosetting compound ('molding compound'), such as an epoxy resin, to form a package body 124 which protects the chip 140 from external environmental stresses. Molding dams 122 may be formed on the printed circuit board 123 to prevent the flowing out of the molding compound during the molding process.

The mounting of the COB package 120 to the base card 110 will now be described. An adhesion means 130, such as adhesive tape, is placed on the bottom 112b of the first section 112 of the receiving part 113. The COB package 120 is aligned with the receiving part 113. Specifically, the package body 124 of the COB package 120 is aligned with the second section 114 of the receiving part 113 while the periphery 123a of the printed circuit board 123 is aligned with the first section 112. Then, the periphery 123a of the printed circuit board 123 is pressed while heat is supplied thereto by, for example, a thermo-press machine (not shown) to attach the COB package 120 to the base card 110. Note, the adhesive tape 130 has an opening 132 through which the second section 114 of the receiving part 113 is exposed.

Since the slope of the bevel 118 is less vertical compared with that of the package body 124 of the COB package 120, there will be an annular space 150 (see FIG. 7) along the interface of the bevel 118, the outer surface of the package body 124 of the COB package and a surface of the printed circuit board 123. Any molding by-products 125, such as epoxy burrs or molding flashes of the COB package 120, will be located in the space 150 so that the reliability of the mounting of the COB package 120 to the base card 110 can be assured.

Figure 9:
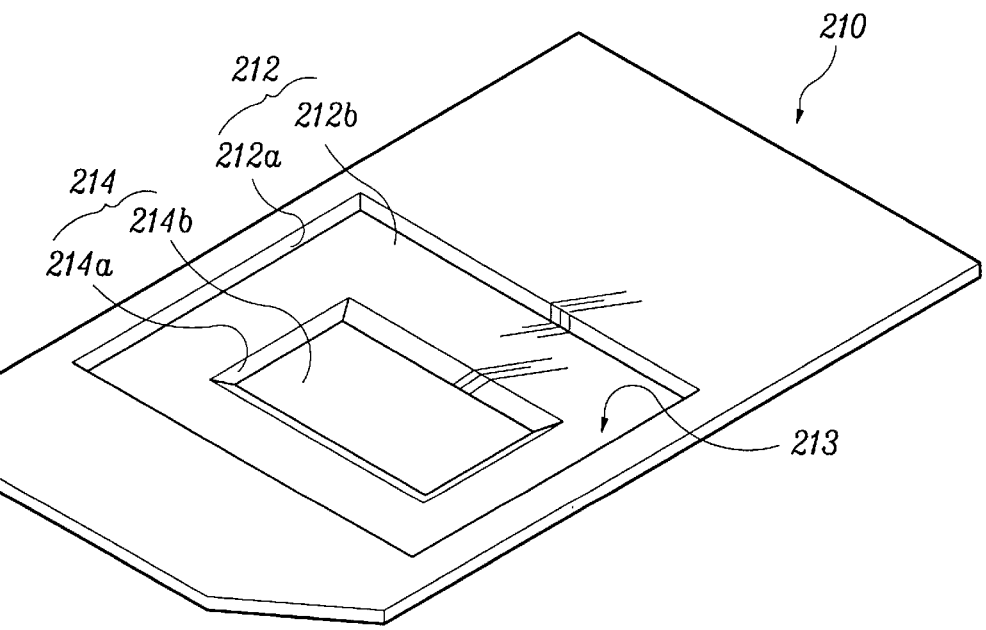
FIG. 9 is a perspective view of a second embodiment of the base card according to the present invention.

FIG. 9 is a perspective view of a base card for use in manufacturing the second embodiment of the chip card according to the present invention. In this embodiment, the thickness of the base card is the same as or greater than that of the COB package, and the second section of the receiving part of the base card has an open bottom.

The middle of the base card 210 is stepped downward with respect to one surface, for example the upper surface of the base card 210, to from a receiving part 213. The receiving part 213 is for receiving a COB package, and consists of a first section 212 and a second section 214. As described previously, the COB package has a printed circuit board, a semiconductor chip electrically connected to the printed circuit board via bonding wires, and a package body encapsulating the chip and the bonding wires. The periphery 123a of the printed circuit board surrounds the package body. The first section 212 of the receiving part 213 has a shape complementary to that of and for receiving the periphery 123a of the COB package, and is defined by a side surface 212a and a bottom surface 212b. The second section 214 of the receiving part 214 extends downward at an inclination from the bottom surface 212b of the first section 212 of the receiving part 213 and receives the package body 124. This second section 214 is defined by an inclined surface 214a and a bottom opening 214b. A characteristic feature of this embodiment is that the bottom of the second section 214 of the receiving part 213 is in fact open.

Figure 10:
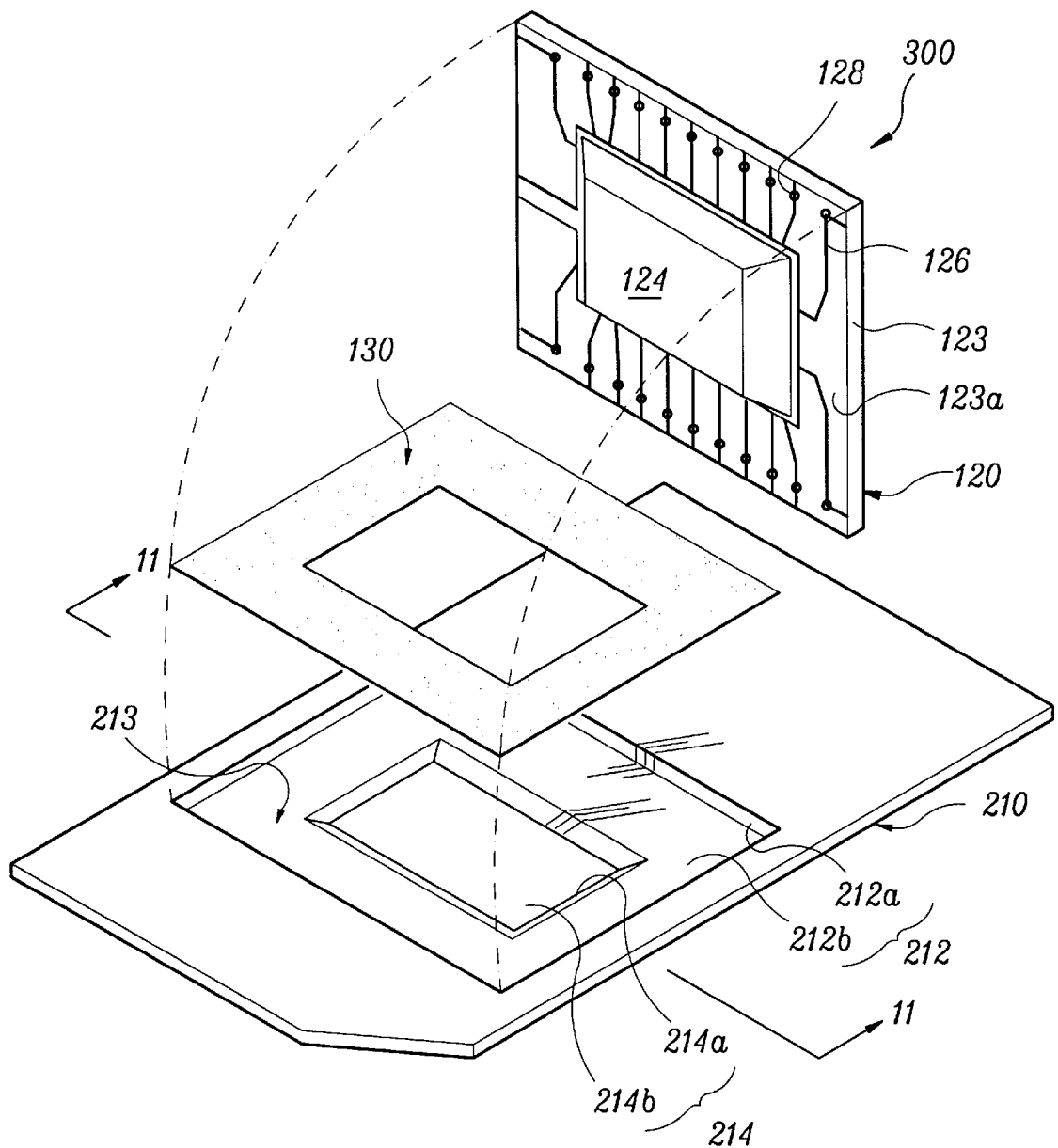
FIG. 10 is an exploded perspective view of the second embodiment of a chip card comprising the base card shown in FIG. 9.
Figure 11:
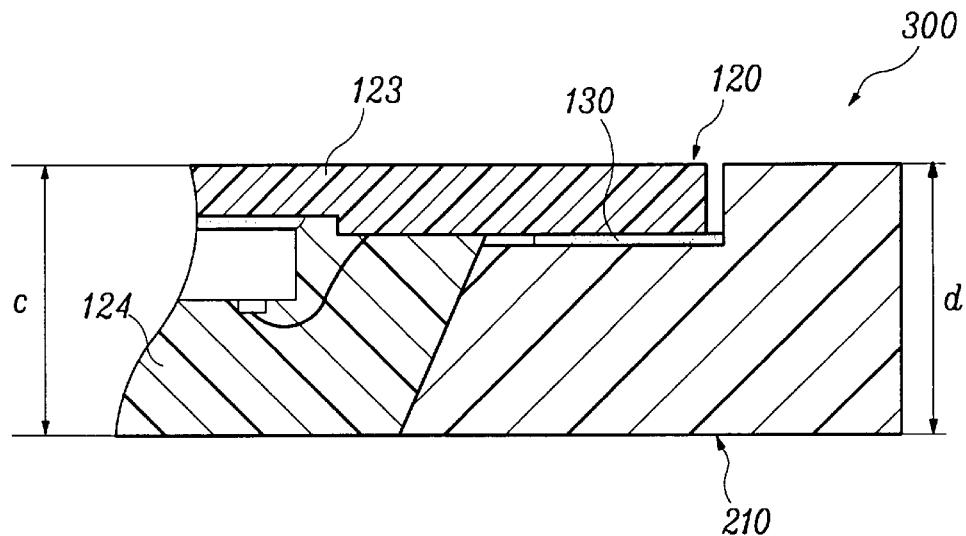
FIG. 11 is a partial cross-sectional view taken along line 11—11 in FIG. 10.

The reason, according to the present invention, behind the provision of the opening 214b in the base card will be described hereinafter with reference to FIGS. 9–11.

The chip card 300 consists of a COB package 120 and a base card 210 which receives and is attached to the package 120 by adhesion means 130, such as adhesive tape.

The COB package 120 is attached to the base card 210 as follows. The adhesion means 130 is provided on the bottom surface 212b of the first section 212 of the receiving part 213. The COB package 120 is fitted into the receiving part 113 in such a manner that package body 124 of COB package 120 is received in the second section 214 of the receiving part 213 while the periphery 123a of the printed circuit board 123 is received in the first section 212 of the receiving part 213. Then, the periphery 123a of the printed circuit board 123 is pressed while heat is supplied thereto by, for example, a thermo-press machine (not shown), to attach the COB package 120 to the base card 210.

The chip card 300 thus formed has its bottom exposed due to the opening 214b of the second section 214 of the receiving part 213, and has external connection means (not shown) of its printed circuit board 123 exposed at the upper surface of base card 210.

The second embodiment of the base card 210 according to the present invention is easily manufactured since it has an open bottom and, therefore, is free of the difficulty involved in molding a thin uniform bottom portion. Moreover, since the thickness 'd' of the base card 210 can be the same as that 'c' of the COB package 120, it is possible to obtain a thin chip card 300. However, if the thickness 'd' of the base card 210 is less than the thickness 'c' of the COB package 120 which will be received by the base card, a portion of the body of the COB package 120 will be exposed and thus, could be damaged. Therefore, it is preferable for the base card 210 to have a thickness 'd' that is the same as or greater than the thickness 'c' of the COB package so that the package body 124 can be located in the same plane as the base card 210 or can be located entirely within the receiving part 213.

Figure 12:
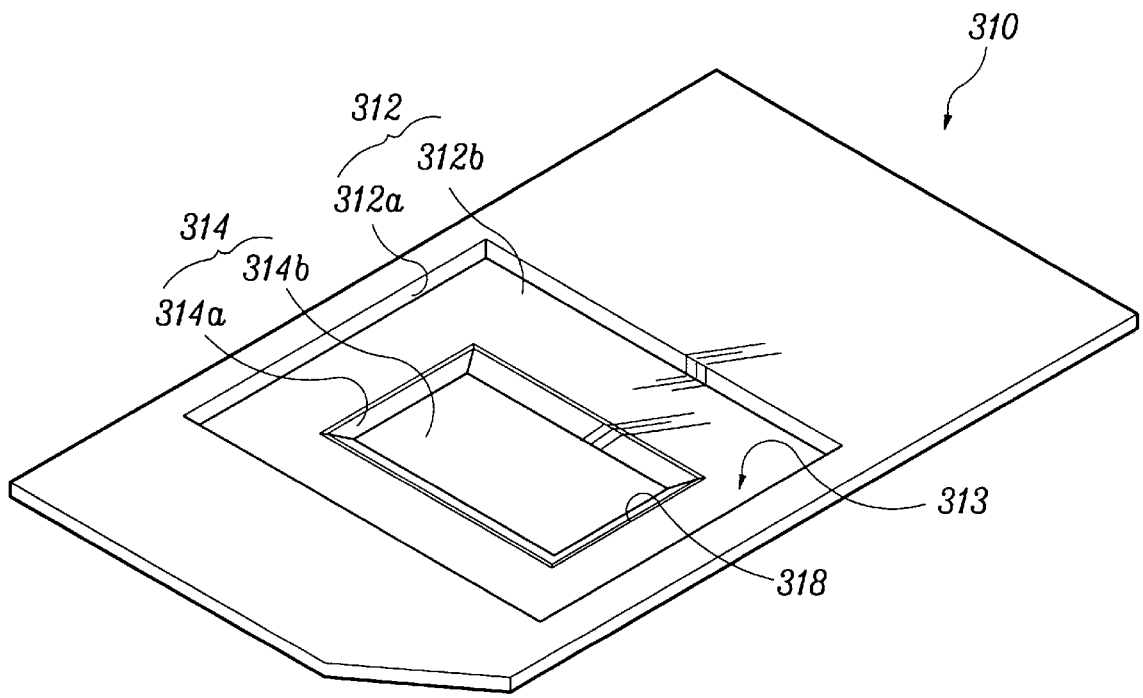
FIG. 12 is a perspective view depicting a third embodiment of the base card according to the present invention.

FIG. 12 is a perspective view of a base card for use in manufacturing the third embodiment of a chip card according to the present invention. In this embodiment, the base card combines the features of FIGS. 8 and 11, i.e., it has both a bevel and an open bottom. The structure of the base card will first be described.

The middle of the base card 310 is stepped downward with respect to one surface, for example the upper surface of the base card 310, to form a receiving part 313. The receiving part 313 is for receiving a COB package having the same structure as those of the COB packages described with reference to the first and second embodiments of the present invention. The receiving part consists of a first receiving section 312 and a second receiving section 314.

The base card 310 has a bevel 318 corresponding to that of the first embodiment as well as an opening 314b corresponding to that of the second embodiment. Moreover, like the first and second embodiments, the first section 312 of the receiving part 313 of the base card 310 has a shape complementary to that of and for receiving the periphery of the COB package; and the second section 314 of the receiving part 313 extends downwards at an inclination from the bottom 312b of the first section 312 and receives the package body. The first and second sections 312 and 314 of the receiving part 313 are defined by side surfaces 312a, 314a and bottom surface 312b and open bottom 314b, respectively. The bevel 318 is formed where the bottom 312b of the first section 312 of the receiving part 313 joins the inclined side surface 314a.

Figure 13:
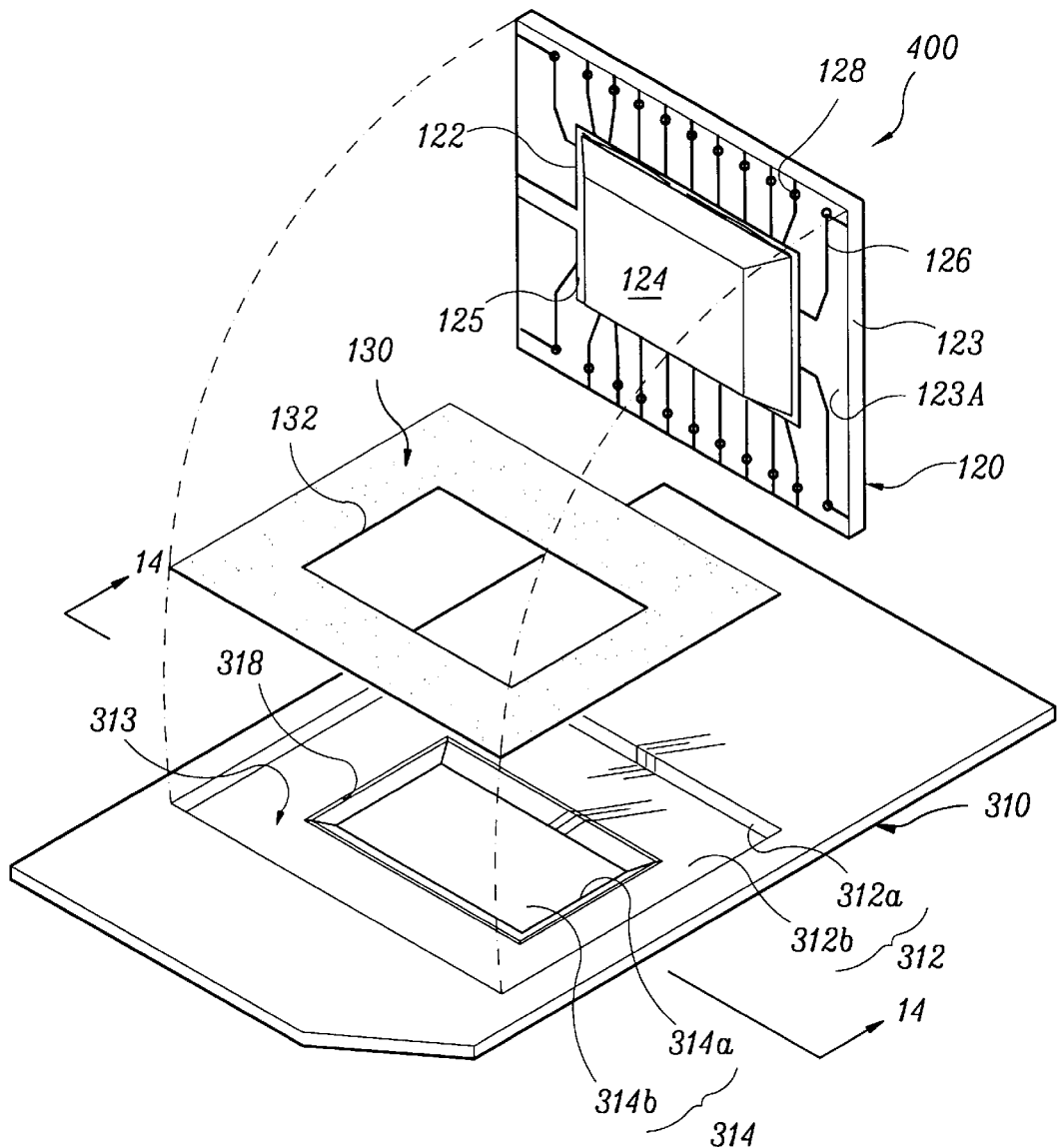
FIG. 13 is an exploded perspective view of the third embodiment of a chip card comprising the base card shown in FIG. 12.
Figure 14:
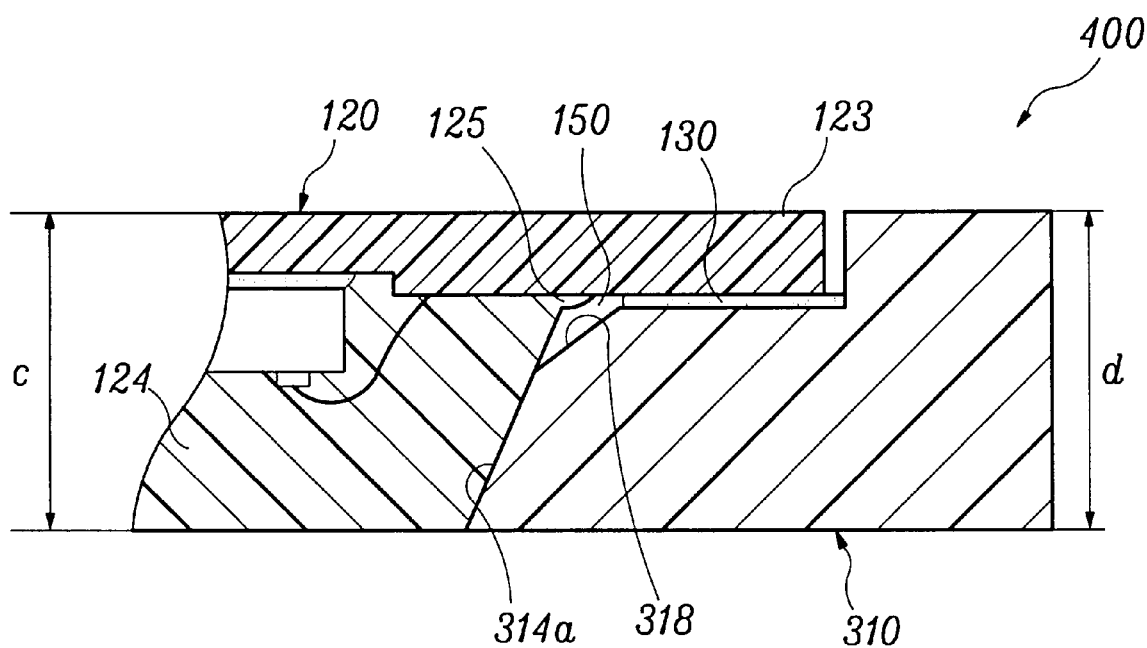
FIG. 14 is a partial cross-sectional view taken along line 14—14 in FIG. 13.

The third embodiment of the chip card 400 according to the present invention will be described with reference to FIGS. 13 and 14. The chip card 400 consists of a COB package 120 and the base card 310. The base card 310 receives and is attached to the package 120 by adhesion means 130, such as adhesive tape as follows.

The adhesion means 130, such as adhesive tape, is provided on the bottom 312b of the first section 312 of the receiving part 313. The COB package 120 is fitted into the receiving part 313 in such a manner that the package body 124 of the COB package 120 is received in the second section 314 of the receiving part 314 while the periphery 123a of the printed circuit board 123 is received in the first section 312. Then, the periphery 123a of the printed circuit board 123 is pressed while heat is supplied thereto by, for example, a thermal-press machine (not shown), to attach the COB package 120 to the base card 310.

Since the slope of bevel 318 is less vertical compared with that of the package body 124 of the COB package, there will be an annular space 150 along the interface of the bevel 318, the outer surface of the package body 124 of the COB package 120, and a surface of the printed circuit board 123. Any molding by-products 125, such as epoxy burrs or molding flashes of the COB package 120, will be located in the space 150.

The chip card 400 thus obtained has a structure in which the bottom of the package body 124 is exposed through the opening 314b of the second section 314 of the receiving part 313, and external connection means of the printed circuit board 123 are exposed at the upper surface of the base card 310.

Since the thickness 'd' of the base card 310 can be the same as that 'c' of the COB package 120, it is possible to obtain a thin chip card 400. However, if the thickness 'd' of the base card 310 is less than the thickness 'c' of the COB package 120 which will be received into the base card 310, a portion of the body of the COB package 120 will be exposed and thus, could be damaged. Therefore, it is preferable for the base card 310 to have a thickness 'd' that is the same as or greater than the thickness 'c' of the COB package 120 so that the package body 124 can be located in the same plane as the base card 310 or can be located entirely within the receiving part 313.

The present invention as described above has the following advantages: (1) since the slope of bevel is less vertical compared to that of the package body of the COB package, there will be an annular space along the interface of the bevel, the outer surface of the package body of the COB package, and a surface of the printed circuit board, and any molding by-products, such as epoxy burrs or molding flashes of the COB package, will be located in the space so that the reliability of the mounting of the COB package to the base card can be assured; (2) the base card has an open bottom to obviate the possibility of chip card failure or alignment error of the COB package which is always present when the base card has a thin bottom; and (3) because the lower part of the package body is exposed at the bottom of the base card and the external connection means of the COB package are exposed at the top of the base card, the chip card can be as thin as the COB package itself.

Although preferred embodiments of the present invention have been described in detail hereinabove, it should be clear that many variations and/or modifications of the basic inventive concepts taught herein will be apparent to those of ordinary skill in the art. All such variations and/or modifications are thus seen to be within the true spirit and scope of the present invention as defined by the appended claims.

What is claimed is:

1. A base card for receiving a Chip on Board (COB) package having a printed circuit board, a semiconductor chip electrically connected to the printed circuit board via electrical connections and around which a peripheral portion of the printed circuit board extends, and a package body encapsulating the chip and the electrical connections, said base card comprising:

an upper surface, a middle portion which is stepped downward from said upper surface to form a receiving part configured to receive the COB package, and a bottom surface, said receiving part consisting of a first section for receiving the peripheral portion of the COB package and a second section for receiving the package body of the COB package, said first section including a side surface extending downward from said upper surface, and a bottom surface defining the bottom of said first section, and said second section including an inclined surface extending downwardly at an inclination with respect to the bottom surface of the first section of said receiving part, and a bevel extending from the bottom surface of the first section of said receiving part to said inclined surface, said bevel having a slope greater than that of said bottom surface of the first section of said receiving part and less than that of said inclined surface, whereby an annular space will be formed between said bevel, the package body of the COB package, and the printed circuit board when the COB package is mounted and attached to the base card with the peripheral portion of the printed circuit board received in the first section of said receiving part and the package body received in the second section of said receiving part.

2. A base card according to claim 1, wherein the inclined surface of the second section of said receiving part extends to the bottom surface of the base card so as to form an opening at the bottom surface of the base card where the package body of the COB package will be exposed when the COB package is mounted and attached to the base card.

3. A base card according to claim 1, wherein the second section of said receiving part also includes a bottom surface spaced from said bottom surface of the base card so as to form therewith a bottom of the base card, said inclined surface terminating at the bottom surface of the second section of said receiving part.

4. A base card according to claim 3, wherein said bottom of the base card has a thickness of about 140 microns.

5. A base card for receiving a Chip on Board (COB) package having a printed circuit board, a semiconductor chip electrically connected to the printed circuit board via electrical connections and around which a peripheral portion of the printed circuit board extends, and a package body encapsulating the chip and the electrical connections, said base card comprising:

an upper surface, a middle portion which is stepped downward from said upper surface to form a receiving part configured to receive the COB package, and a bottom surface, said receiving part consisting of a first section for receiving the peripheral portion of the COB package and a second section for receiving the package body of the COB package, said first section including a side surface extending downward from said upper surface, and a bottom surface defining the bottom of said first section, and said second section including an inclined surface extending downwardly, at an inclination with respect to the bottom surface of the first section of said receiving part, to the bottom surface of the base card so as to form an opening at the bottom surface of the base card where the package body of the COB package will be exposed when the COB package is mounted and attached to the base card, and a bevel extending from the bottom surface of the first section of said receiving part to said inclined surface, said bevel having a slope greater than that of said bottom surface of the first section of said receiving part and less than that of said inclined surface, whereby an annular space will be formed between said bevel, the package body of the COB package, and the printed circuit board when the COB package is mounted and attached to the base card with the peripheral portion of the printed circuit board received in the first section of said receiving part and the package body received in the second section of said receiving part.

6. A chip card comprising a COB package; a base card; and adhesive means for attaching said COB package to said base card, said COB package having a printed circuit board, a semiconductor chip, electrical connections electrically connecting said chip to said printed circuit board, and a package body encapsulating said chip and said electrical connections, said printed circuit board having a peripheral portion extending around said package body, said base card having an upper surface, a middle portion which is stepped downward from said upper surface to form a receiving part having a shape complementary to that of the COB package, and a bottom surface, said receiving part consisting of a first section having a shape complementary to that of and for receiving said peripheral portion of the COB package, and a second section receiving said package body of the COB package, said first section including a side surface extending downward from said upper surface, and a bottom surface defining the bottom of said first section, and said second section including an inclined surface extending downwardly at an inclination with respect to the bottom surface of the first section of said receiving part, and a bevel extending from the bottom surface of the first section of said receiving part to said inclined surface, said bevel having a slope greater than that of said bottom surface of the first section of said receiving part and less than that of said inclined surface, an annular space being formed between said bevel, said package body of the COB package, and said printed circuit board, and said adhesion means attaching said peripheral portion of the printed circuit board to said bottom surface of the first section of said receiving part.

7. A chip card according to claim 6, wherein said package body comprises a molding compound by which the package body is attached to said printed circuit board, and a by-product of a molding process by which said package body was attached to said printed circuit board is accommodated in said annular space.

8. A chip card according to claim 6, wherein said adhesion means is adhesive tape.

9. A chip card according to claim 8, wherein said adhesive tape is ring-shaped and has an area equal to that of the bottom surface of the first section of said receiving part of the base card.

10. A chip card according to claim 8, wherein said base card has a maximum thickness which is at least as great as that of said COB package.

11. A chip card according to claim 6, wherein the inclined surface of the second section of said receiving part extends to the bottom surface of the base card so as to form an opening at the bottom surface of the base card, said package body of the COB package being exposed through said opening.

12. A chip card comprising a COB package; a base card; and adhesive means for attaching said COB package to said base card, said COB package having a printed circuit board, a semiconductor chip, electrical connections electrically connecting said chip to said printed circuit board, and a package body encapsulating said chip and said electrical connections, said printed circuit board having a peripheral portion extending around said package body, said base card having an upper surface, a middle portion which is stepped downward from said upper surface to form a receiving part having a shape complementary to that of the COB package, and a bottom surface, said receiving part consisting of a first section having a shape complementary to that of and for receiving said peripheral portion of the COB package, and a second section receiving said package body of the COB package, said first section including a side surface extending downward from said upper surface, and a bottom surface defining the bottom of said first section, and said second section including an inclined surface extending downwardly, at an inclination with respect to the bottom surface of the first section of said receiving part, to the bottom surface of the base card so as to form an opening at the bottom surface of the base card, said package body of the COB package being exposed through said opening, and a bevel extending from the bottom surface of the first section of said receiving part to said inclined surface, said bevel having a slope greater than that of said bottom surface of the first section of said receiving part and less than that of said inclined surface, an annular space being formed between said bevel, said package body of the COB package, and said printed circuit board, and said adhesion means attaching said peripheral portion of the printed circuit board to said bottom surface of the first section of said receiving part.

13. A chip card according to claim 12, wherein said package body comprises a molding compound by which the package body is attached to said printed circuit board, and a by-product of a molding process by which said package body was attached to said printed circuit board is accommodated in said annular space.

14. A chip card according to claim 12, wherein said adhesion means is adhesive tape.

15. A chip card according to claim 14, wherein said adhesive tape is ring-shaped and has an area equal to that of the bottom surface of the first section of said receiving part of the base card.

16. A chip card according to claim 12, wherein said base card has a maximum thickness which is at least as great as that of said COB package.

17. A chip card comprising a COB package; a base card; and adhesion means for attaching said COB package to said base card, said COB package having a printed circuit board, a semiconductor chip, electrical connections electrically connecting said chip to said printed circuit board, and a package body encapsulating said chip and said electrical connections, said package body comprising a molding compound by which the package body is attached to said printed circuit board, and a by-product of a molding process by which said package body was attached to said printed circuit board, and said printed circuit board having a peripheral portion extending around said package body, said base card having an upper surface, a middle portion which is stepped downward from said upper surface to form a receiving part having a shape complementary to that of the COB package, and a bottom surface, said receiving part consisting of a first section having a shape complementary to that of and for receiving said peripheral portion of the COB package, and a second section receiving said package body of the COB package, said first section including a side surface extending downward from said upper surface, and a bottom surface defining the bottom of said first section, and said second section including an inclined surface extending downwardly at an inclination with respect to the bottom surface of the first section of said receiving part, and a bevel extending from the bottom surface of the first section of said receiving part to said inclined surface, said bevel having a slope greater than that of said bottom surface of the first section of said receiving part and less than that of said inclined surface, an annular space being formed between said bevel, said package body of the COB package, and said printed circuit board, said by-product of the molding process being accommodated in said annular space, and said adhesion means attaching said peripheral portion of the printed circuit board to said bottom surface of the first section of said receiving part.

18. A chip card according to claim 17, wherein said adhesion means is adhesive tape.

19. A chip card according to claim 18, wherein said adhesive tape is ring-shaped and has an area equal to that of the bottom surface of the first section of said receiving part of the base card.

20. A chip card according to claim 17, wherein said base card has a maximum thickness which is at least as great as that of said COB package.

* * * * *